(12) United States Patent
Moshayedi (10) Patent No.: US 8,344,518 B2
(45) Date of Patent: Jan. 1, 2013

(54) APPARATUS FOR STACKING INTEGRATED CIRCUITS

(75) Inventor: Mark Moshayedi, Newport Coast, CA (US)

(73) Assignee: STEC, Inc., Santa Ana, CA (US)

( * ) Notice: Subject to any disclaimer, the term of this patent is extended or adjusted under 35 U.S.C. 154(b) by 364 days.

(21) Appl. No.: 12/828,175

(22) Filed: Jun. 30, 2010

(65) Prior Publication Data

US 2010/0327436 A1    Dec. 30, 2010

Related U.S. Application Data

(60) Division of application No. 10/953,248, filed on Sep. 28, 2004, now Pat. No. 7,902,651, which is a continuation of application No. 10/157,749, filed on May 28, 2002, now abandoned.

(60) Provisional application No. 60/293,766, filed on May 25, 2001, provisional application No. 60/294,389, filed on May 29, 2001.

(51) Int. Cl.
     *H01L 23/52*      (2006.01)
(52) U.S. Cl. .......... 257/777; 257/E23.068; 257/E23.141
(58) Field of Classification Search .................. 257/737, 257/777, E23.068, E23, 141
See application file for complete search history.

(56) References Cited

U.S. PATENT DOCUMENTS

| | | | |
|---|---|---|---|
| 5,128,831 A | 7/1992 | Fox, III et al. | |
| 5,222,014 A | 6/1993 | Lin | |
| 5,239,198 A | 8/1993 | Lin et al. | |
| 5,362,679 A | 11/1994 | Wakefield | |
| 5,400,904 A | 3/1995 | Maston, III et al. | |
| 5,444,296 A | 8/1995 | Kaul et al. | |
| 5,509,200 A | 4/1996 | Frankeny et al. | |
| 5,514,907 A | 5/1996 | Moshayedi | |
| 5,591,941 A | 1/1997 | Acocella et al. | |
| 5,612,570 A | 3/1997 | Eide et al. | |
| 5,656,856 A | 8/1997 | Kweon | |
| 5,713,744 A | 2/1998 | Laub | |
| 5,751,063 A | 5/1998 | Baba | |
| 5,758,413 A | 6/1998 | Chong et al. | |
| 5,783,461 A | 7/1998 | Hembree | |
| 5,861,666 A | 1/1999 | Bellaar | |
| 6,014,316 A | 1/2000 | Eide | |
| 6,121,676 A | 9/2000 | Solberg | |
| RE36,916 E | 10/2000 | Moshayedi | |

(Continued)

FOREIGN PATENT DOCUMENTS

JP      6-77644      3/1994

(Continued)

OTHER PUBLICATIONS

Edge-Mounted MLC Packaging Scheme, IBM Technical Disclosure Bulletin, May 1981, vol. 23, No. 12.

*Primary Examiner* — Matthew Reames
*Assistant Examiner* — Nikolay Yushin
(74) *Attorney, Agent, or Firm* — McDermott Will & Emery LLP

(57) ABSTRACT

A multi-chip stack module provides increased circuit density for a given surface chip footprint. Support structures are alternated with standard surface mount type chips to form a stack wherein the support structures electrically interconnect the chips. One aspect is a structure and method for interconnecting a plurality of generally planar chips in a vertical stack such that signals, which are common to the chips, are connected in the stack and signals, which are accessed individually, are separated within the stack.

13 Claims, 10 Drawing Sheets

| U.S. PATENT DOCUMENTS | | | | FOREIGN PATENT DOCUMENTS | | |
|---|---|---|---|---|---|---|
| 6,130,823 A | 10/2000 | Lauder et al. | JP | 07-014980 | | 1/1995 |
| 6,160,718 A | 12/2000 | Vakilian | JP | 2002-305286 | | 10/2002 |
| 6,225,688 B1 | 5/2001 | Kim et al. | TW | 411540 | | 11/2000 |
| 6,473,308 B2 | 10/2002 | Forthun | WO | WO 98/25301 | | 6/1998 |
| 6,492,714 B1 | 12/2002 | Kasatani | WO | WO 99/57765 | | 11/1999 |

| PIN | SYMBOL | PIN | SYMBOL | PIN | SYMBOL | PIN | SYMBOL |
|---|---|---|---|---|---|---|---|
| 1 | VDD | 23 | /RAS | 45 | CK | 67 | DQ16 |
| 2 | DQ0 | 24 | /CS | 46 | /CK | 68 | DQ17 |
| 3 | VDDQ | 25 | NC | 47 | UDM0 | 69 | DQ18 |
| 4 | DQ1 | 26 | BA0 | 48 | VSS | 70 | DQ19 |
| 5 | DQ2 | 27 | BA1 | 49 | VREF | 71 | DQ20 |
| 6 | VSSQ | 28 | A10/AP | 50 | UDQS1 | 72 | DQ21 |
| 7 | DQ3 | 29 | A0 | 51 | UDQS0 | 73 | DQ22 |
| 8 | DQ4 | 30 | A1 | 52 | VSSQ | 74 | UDM1 |
| 9 | VDDQ | 31 | A2 | 53 | DQ24 | 75 | DQ25 |
| 10 | DQ5 | 32 | A3 | 54 | DQ8 | 76 | DQ26 |
| 11 | DQ6 | 33 | VDD | 55 | VDDQ | 77 | DQ27 |
| 12 | VSSQ | 34 | VSS | 56 | DQ9 | 78 | DQ28 |
| 13 | DQ7 | 35 | A4 | 57 | DQ10 | 79 | DQ29 |
| 14 | DQ23 | 36 | A5 | 58 | VSSQ | 80 | DQ30 |
| 15 | VDDQ | 37 | A6 | 59 | DQ11 | 81 | DQ31 |
| 16 | LDQS0 | 38 | A7 | 60 | DQ12 | | |
| 17 | LDQS1 | 39 | A8 | 61 | VDDQ | | |
| 18 | VDD | 40 | A9 | 62 | DQ13 | | |
| 19 | LDM1 | 41 | A11 | 63 | DQ14 | | |
| 20 | LDM0 | 42 | A12 | 64 | VSSQ | | |
| 21 | /WE | 43 | NC | 65 | DQ15 | | |
| 22 | /CAS | 44 | CKE0 | 66 | VSS | | |

FIG.3B

| PIN SYMBOL | PIN FUNCTION |
|---|---|
| A0 - A12 | ADDRESS INPUT |
| BA0, BA1 | BANK SELECT |
| DQ0-15, DQ16-31* | DATA IN/OUT |
| /WE | WRITE ENABLE |
| CK, /CK | CLOCK INPUT |
| CKE0 | CLOCK ENABLE |
| /RAS | ROW ADDRESS STROBE |
| /CAS | COLUMN ADDRESS STROBE |
| LDM0-1, UMD0-1 | DATA MASK |
| LDQS0-1, UDQS0-1 | DATA STROBE |
| /CS | CHIP SELECT INPUT |
| VDD | POWER SUPPLY |
| VDDQ | DQ POWER SUPPLY |
| VSS | GROUND |
| VSSQ | DQ GROUND |
| VREF | REFERENCE VOLTAGE |
| NC | NOT CONNECTED |

APPARATUS FOR STACKING INTEGRATED CIRCUITS

RELATED APPLICATIONS

This application is a divisional of U.S. patent application Ser. No. 10/953,248, filed Sep. 28, 2004, which is a continuation of U.S. patent application Ser. No. 10/157,749, filed on May 28, 2002, now abandoned, which claims priority to U.S. Provisional Patent Application No. 60/294,389, filed on May 29, 2001, and U.S. Provisional Patent Application No. 60/293,766, filed on May 29, 2001, the contents of which are incorporated herein by reference.

BACKGROUND OF THE INVENTION

1. Field of the Invention

The invention relates to the vertical stacking of integrated circuits to increase the density of components on a printed circuit board without increased footprint. More particularly, the present invention relates to apparatus and methods for the vertical stacking of memory integrated circuits on a surface mount printed circuit board.

2. Description of the Related Art

Modern electronic devices, such as computers and the like, typically include integrated circuits commonly referred to and will be referred to herein as "chips". Integrated circuits or chips are microcircuits formed on a semiconductor substrate and packaged in a ceramic, plastic or epoxy package having multiple external terminals or "pins". The microcircuits are wire-bonded within the package to the external terminals or pins. When the pins of the chip packages are connected to the printed circuit board, the integrated circuits are electrically connected to other integrated circuits and electrical components through or by way of traces on the printed circuit board to form system level electronic circuits.

With advances in semiconductor device processing has come a continuing increase in device count and density within chips and this has driven a corresponding increase in the count and density of the external conducting pads. Current technology places a limit on how small external contacts can be made and how closely they can be placed adjacent one another while still maintaining circuit integrity. Limits are imposed, both by the limitations of machinery to form eversmaller conductive elements and by the reduction in production yield as the limits are pushed.

Additionally, as modern electronic devices are driven to ever increasing functionality and decreasing size, the printed circuit boards within the electronic devices, are driven to increased integrated circuit densities. The desire to provide the capability of integrated circuits to be used in relatively small devices limits the extent to which multiple chips can be laterally interconnected while still fitting within the device. Lateral extension and interconnection of chips tends to lead to relatively long interconnects or traces between chips which increases the signal propagation delay and thus, decreases the circuit operating speed. Further, lengthy traces increase both the radio-frequency interference (RFI), and electromagnetic interference (EMI) emitted from the printed circuit board.

From the foregoing, it can be appreciated that there is an ongoing need for structures and methods for interconnecting chips that increase circuit density without increasing the chip footprint and with minimal increase in interconnection length.

SUMMARY OF THE INVENTION

The aforementioned needs are satisfied by the invention in which one aspect is various structures and methods for interconnecting a plurality of generally planar chips in a vertical stack such that signals, which are common to the chips, are connected in the stack and signals, which are accessed individually, are separated within the stack. The structures and methods include the aspect that the footprint of the stack does not exceed the sum of the individual footprints of the chips in the stack.

A certain aspect of the invention is a chip stack assembly comprising a substrate that defines a plurality of surface mount pads, a first chip having a first set of contacts extending outward, a second chip having a second set of contacts extending outward therefrom, at least one support member positioned on the substrate having a first surface with a first set of mounting pads positioned thereon and a second surface having a second set of mounting pads positioned thereon wherein the first and second surfaces are displaced from each other by a first distance in a first direction and wherein the first set of contacts are attached to the first set of mounting pads and the second set of contacts are attached to the second set of mounting pads such that the first and second chips are supported so as to be displaced from each other in the first direction and wherein the at least one support member further includes at least one interconnect that interconnects at least one contact of the first and second set of contacts so as to electrically interconnect the at least one contact of first and second set of contacts and wherein the at least one support member further includes at least one via connection that extends in the first direction through the at least one support member to the substrate so that at least one individual contact of the first set of contacts can be electrically coupled to the surface mount pad of the substrate while being electrically isolated from the second set of contacts.

The invention is also a method of mounting a plurality of chips into a stacked configuration, the method comprising attaching a first set of contacts of a first chip to a first set of mounting pads formed on a first surface of a support structure, attaching a second set of contacts of a second chip to a second set of mounting pads formed on a second surface of the support structure, wherein attaching the first and second sets of contacts to the support structure results in the first and second chips being positioned in a stacked orientation with respect to each other, electrically interconnecting at least one selected contact of first and second sets of contacts using the support structure, electrically connecting the at least one contact of the first and second set of contacts to a mounting pad on a substrate such that the electrically interconnected at least one contact receives a common signal, forming an isolated pathway from at least one other of the first set of contacts to a mounting pad on the substrate; and electrically connecting at least one other contact from the first set of contacts to a mounting pad formed on the substrate using the isolated pathway so that the at least one other contact is electrically isolated from the second set of contacts such that the at least one other contact receives an individual signal.

An additional aspect of the invention is a chip stack for mounting on a substrate having a plurality of contact pads comprising at least a first and a second chip and a conducting interconnecting means for interconnecting the chips and maintaining the chips in a stacked configuration so that the chips are interconnected with at least one contact on the first and second chips being electrically interconnected and wherein the interconnecting means interconnects the at least one of the contacts of the first chip to a contact pad on the substrate in a manner that isolates the contact of the first chip from the contacts of the second chip.

The invention also includes the aspects of a chip stack of at least one preformed support structure interconnecting a first chip to a second chip wherein the support structure comprises a member having a first surface and a second surface, a plurality of surface mount pads disposed along the first surface and the second surface of the member, a plurality of vias disposed between the first surface and the second surface of the member; and a plurality of conducting elements wherein the conducting elements interconnect the surface mount pads and the vias.

Yet another aspect of the invention is a chip stack module comprising a first chip comprising a first set of common contacts and a first set of individual contacts, a second chip comprising a second set of common contacts and a second set of individual contacts, and an interconnecting structure wherein the interconnecting structure further includes at least one interconnect and at least one via connection whereby the interconnecting structure interconnects the first and second chips wherein the first set of common contacts is electrically connected to the second set of common contacts and the first set of individual contacts and does not electrically connect to the second set of individual contacts, the first set of common contacts, and the second set of common contacts.

An additional aspect of the invention is a chip stack comprising a first chip having a generally planar formed top surface and first set of contacts formed in a first pattern comprising a first set of signals, and a second set of signals, a second chip having the generally planar formed top surface and a second set of contacts formed in the first pattern comprising a third set of signals and a fourth set of signals, a support structure having a first side and a second side comprising a first set of surface mount pads on the first side, a second set of surface mount pads on the second side, a plurality of conducting elements, a plurality of vias positioned through the support structure from the first side to the second side and spaced from the conducting elements, whereby the conducting elements electrically interconnect the first and third sets of contacts, and the vias electrically conduct the fourth set of contacts without interconnecting the fourth set of contacts to the first, second and third sets of contacts, when the support structure is positioned between stacked first and second chips.

For purposes of summarizing the invention, certain aspects, advantages and novel features of the invention have been described herein. Of course, it is to be understood that not necessarily all such aspects, advantages or features will be embodied in any particular embodiment of the invention.

These and other objects and advantages of the present invention will be more apparent from the following description taken in conjunction with the accompanying drawings.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention. Throughout the drawings, reference numbers are re-used to indicate correspondence between referenced elements.

DETAILED DESCRIPTION OF THE PREFERRED EMBODIMENT

In accordance with one embodiment of the present invention, one multi-chip memory module design is described herein. In order to fully specify this preferred design, various embodiment specific details are set forth, such as the number of memory chips in the module, the capacity, the number of data bits, the pin-outs of the memory chips, the module footprint, and the like. It should be understood, however, that these details are provided only to illustrate one embodiment, and are not intended to limit the scope of the present invention.

Figures 1A, 1B, 1C:
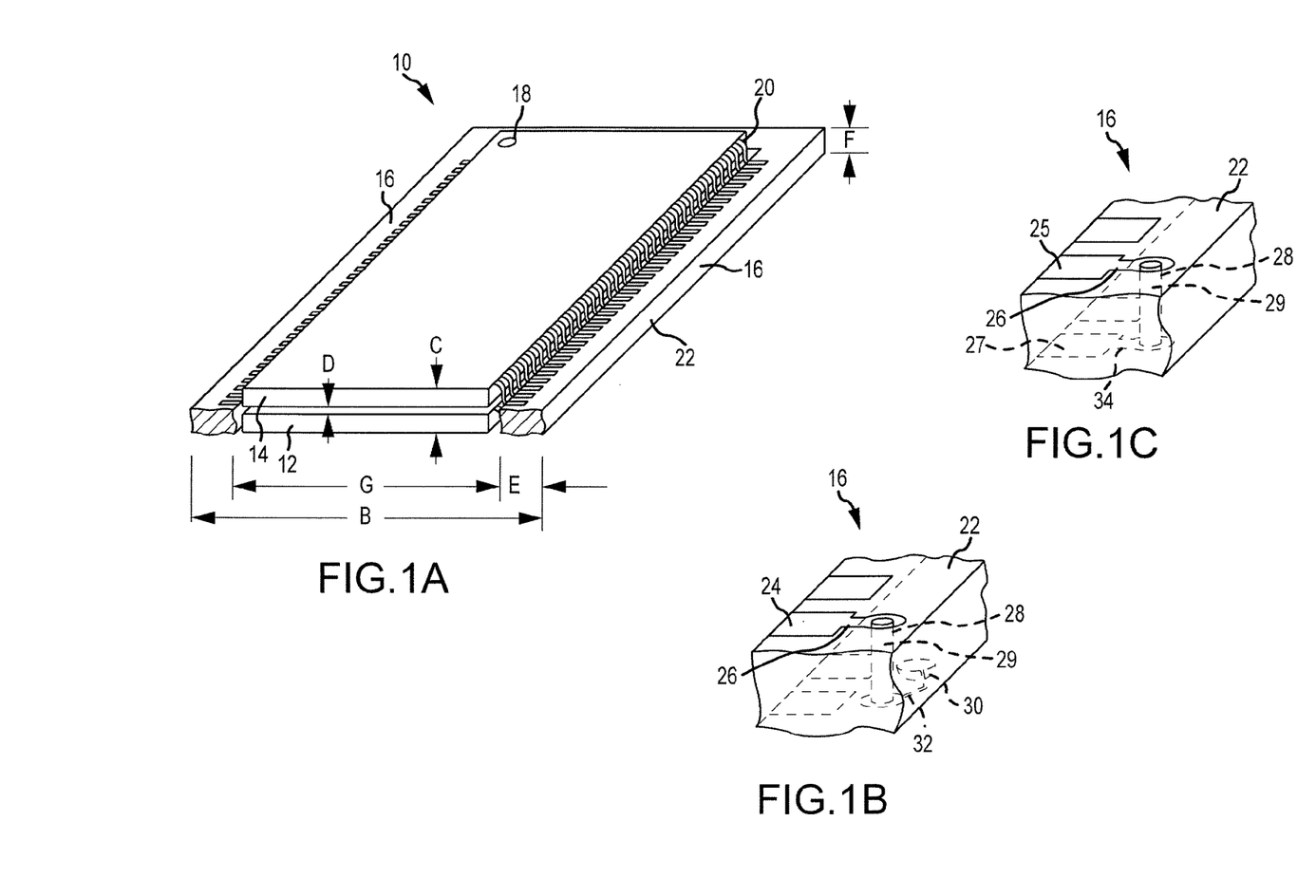
FIG. 1A is a perspective view illustrating a memory chip stack module of the present invention of a preformed support structure vertically interconnecting a first chip to a second chip, according to aspects of an embodiment of the invention.
FIG. 1B is a detail, perspective view of a portion of the preformed support structure of FIG. 1A illustrating the connection path of an individually accessed signal, according to aspects of an embodiment of the invention.
FIG. 1C is a detail, perspective view of a portion of the preformed support structure of FIG. 1A illustrating the connection path of a common signal, according to aspects of an embodiment of the invention.

FIG. 1A illustrates a perspective view of a chip stack module 10 comprising two surface mount chips 12, 14 stacked in accordance with the present invention. The chip stack module 10 further comprises a support member or support structure 16. The support structure 16 holds together and conductively interconnects the vertically stacked chips 12, 14. The chip stack module 10 is configured to be surface mounted to a printed circuit board that has surface mount pads thereon. The chip stack module 10 further comprises a width B, a height C, and a spacing D between stacked chips 12, 14

Surface mount chips 12, 14 comprise a pin 1 indicator 18, a plurality of surface contacts 20, and a width G. In one embodiment, the surface contacts 20 are distributed in two rows of contacts 20, each row disposed along an opposing side of the chip 12, 14 as is generally well known in the art.

The support structure 16 in this embodiment comprises a frame 22 and a plurality of surface mount pads 24. Frame members across a front side without surface contacts 20 of chips 12, 14 are not shown in FIG. 1A in order to illustrate the stacking of chips 12, 14. In another embodiment, frame 22 comprises two rails positioned parallel to each other and perpendicular to a top surface of the chips 12, 14. The surface mount pads 24 are distributed in two rows on each opposing side of frame 22 with a top row of surface mount pads 24 placed along a top surface of the frame 22 and a bottom row of surface mount pads 24 placed along a bottom surface of the frame 22, as shown in FIG. 1B. The top row of surface mount pads 24 aligns over and directly opposes the bottom row of surface mount pads 24. Spacing and alignment of each row of surface mount pads 24 corresponds to the spacing and alignment of the rows of surface contacts 20 of the chips 12, 14.

The frame 22 may comprise a two-layer printed circuit board made of a rigid, non-conducting material such as glass epoxy, FR4, and the like. The frame 22 further comprises the length A, a width E and a height F.

In one embodiment, the height F of the frame 22 is approximately equal to the thickness of one chip 12, 14 so that the stacked chips 12, 14 are nearly touching when the memory chip stack module 10 is assembled. Close spacing D between stacked chips 12, 14 advantageously provides the chip stack module 10 with a low profile, which is desirable in densely populated electronic devices. Alternatively, in another embodiment, the height F of the frame 22 may be advantageously adjusted to increase the spacing D between stacked chips 12, 14, as may be desirable in certain applications to facilitate the cooling of the chips.

When, in one embodiment, chip stack module 10 is assembled, surface contacts 20 of the signals common to both chips 12, 14 are conductively interconnected and all memory locations on both chips 12, 14 can be utilized. However, for proper operation of the chip stack module 10, some signals on each chip 12, 14 are individually accessed and not interconnected. In an embodiment utilizing functionally identical stacked chips 12, 14, the surface contact 20 of the isolated signal of chip 12 is directly below the surface contact of the corresponding isolated signal of chip 14. Similarly, the surface contact 20 of the common signal of chip 12 is directly below the surface contact of the corresponding common signal of chip 14. FIGS. 1B and 1C illustrate a conducting path for an isolated signal and a common signal, respectively.

FIG. 1B illustrates a perspective view of an enlarged portion of the support structure 16 of the present invention. Support structure 16 comprises the frame 22, the surface mount pads 24, a plurality conductive traces 26 and 32, a plurality of vias 28, and a plurality of solder bumps 30. Vias 28 comprise via holes or openings filled with conductive material 29 such that vias 28 are electrically conductive from a top surface of the via 28 to a bottom surface of the via 28.

FIG. 1B further illustrates a conducting path through the frame 22 for the isolated signal of chip 14. Conductive trace 26 on a top surface of frame 22 interconnects the surface mount pad 24 to the top surface of via 28. Conductive trace 32 on a bottom surface of frame 22 interconnects the bottom surface of the via 28 to the solder bump 30. When the chip stack module 10 is assembled, the individually accessed signal of chip 14 conductively connects through surface contact 20 to solder bump 30. Additionally, when the chip stack module 10 is mounted to the printed circuit board, the solder bump 30 conductively connects to the printed circuit board. Thus, the isolated signal of chip 14 conductively connects to the printed circuit board without interconnecting to any other signal on chips 12, 14. The surface contact 20 of the corresponding isolated signal of chip 12 conductively connects to the surface mount pad 24 on the bottom surface of the frame 22 directly below that of the isolated signal of chip 14. When the chip stack module 10 is mounted to the printed circuit board, the surface contact 20 of the corresponding isolated signal of chip 12 conductively connects to the printed circuit board. The short conductive paths of the isolated signals of chips 12, 14 minimize propagation delays and timing problems.

FIG. 1C illustrates a perspective view of an enlarged portion of the support structure 16 of the present invention. Support structure 16 comprises the frame 22, the surface mount pads 24 comprising a first surface mount pad 25 and a second surface mount pad 27, the plurality conductive traces 26, a plurality of conductive traces 34, and the plurality of vias 28. Vias 28 comprise via holes or openings filled with conductive material 29 such that vias 28 are electrically conductive from the top surface of the via 28 to the bottom surface of the via 28.

FIG. 1C further illustrates a conducting path through the frame 22 for the common signal of chips 12, 14. Conductive trace 26 on the top surface of frame 22 interconnects the first surface mount pad 25 to the top surface of the via 28. Conductive trace 34 on the bottom surface of frame 22 interconnects the bottom surface of the via 28 to the second surface mount pad 27 directly below the first surface mount pad 25 on the frame 22. Surface mount pads 25, 27 are conductively connected. When the chip stack module 10 is assembled, the common signal of chip 14 conductively connects through surface contact 20 to surface mount pad 25, through the via 28, to surface mount pad 27. The corresponding common signal of chip 12 conductively connects through the corresponding surface contact 20 to surface mount pad 27. When the chip stack module 10 is mounted on the printed circuit board, the surface contact 20 of the corresponding common signal of chip 12 is conductively connected to the printed circuit board. Thus, the common signals of chips 12, 14 are conductively connected to each other and the printed circuit board. The short conductive paths of the common signals of chips 12, 14 minimize propagation delays and timing problems.

In one embodiment of frame 22, surface mount pads 24 and conductive traces 26 are formed on the top surface, and surface mount pads 24 and conductive traces 32 and 34 are formed on the bottom surface using a film etching process.

Via holes or openings are then drilled through the frame 22 with the via holes or openings positioned substantially perpendicular to the conductive traces 26, 32, 34. A plating process is then used to form conductive material 29 into via cylinders within the vias 28, to interconnect the via cylinders 29 to the appropriate traces 26, 32, 34, and to interconnect the surface mount pads 24 to the appropriate traces 26, 34. To provide good electrical conductivity, the traces 26, 32, 34 and the surface mount pads 24 are plated with approximately 1.4 mil thick conductive material, such as copper or the like, and the vias 28 are plated with approximately 1 mil thick conductive material, such as copper or the like.

In one embodiment of frame 22, solder bumps 30 are formed on the bottom surface of the frame 22. The solder bumps 30 may comprise substantially hemispherical bumps of solder. In other embodiments the solder bumps 30 may comprise solder, a conductive adhesive material such as conductive epoxy, and the like, and may be shaped round, approximately spherical, approximately hemispherical, and the like. The solder bumps 30 are formed so as to substantially approximate the thickness of the surface contact 20 after the chip stack module 10 is mounted to the printed circuit board. This allows the chip stack module 10 to be approximately level when mounted to the printed circuit board. Additionally, the solder bumps 30 provide conductive material to aid in mechanically connecting the chip stack module 10 to the substrate or printed circuit board.

FIG. 1A illustrates the positioning relationship between the chips 12, 14 and the support structure 16. Referring to FIG. 1A, the support structure 16 is positioned over the surface contacts 20 along a first edge and a second edge of chip 12. The surface mount pads 24 along a bottom surface of the support structure 16 are aligned with the surface contacts 20 along the first edge and the second edge of chip 12. Chip 14 is positioned over the support structure 16, such that the surface contacts 20 along a first edge and a second edge of chip 14 align with the surface mount pads 24 along a top surface of the support structure 16. Additionally, chip 14 is positioned over chip 12 such that the pin 1 indicator 18 on chip 14 is aligned and directly over the pin 1 indicator 18 on chip 12. The assembled chip stack module 10 is processed so as to induce conductive material, such as a high temperature solder, to connect to the surface contacts 20 and surface mount pads 24. High temperature solder, such as SN63-PB37 and SN96-AG4, both by AIM Products, and the like, may be used so that the chip stack module 10 can be subsequently mounted to the substrate or printed circuit board using a solder with a lower melting point without melting the conductive material connecting the chips 12, 14 and the support structure 16 together. Other conductive materials that may be used are silver, copper, and the like.

Figure 2A:
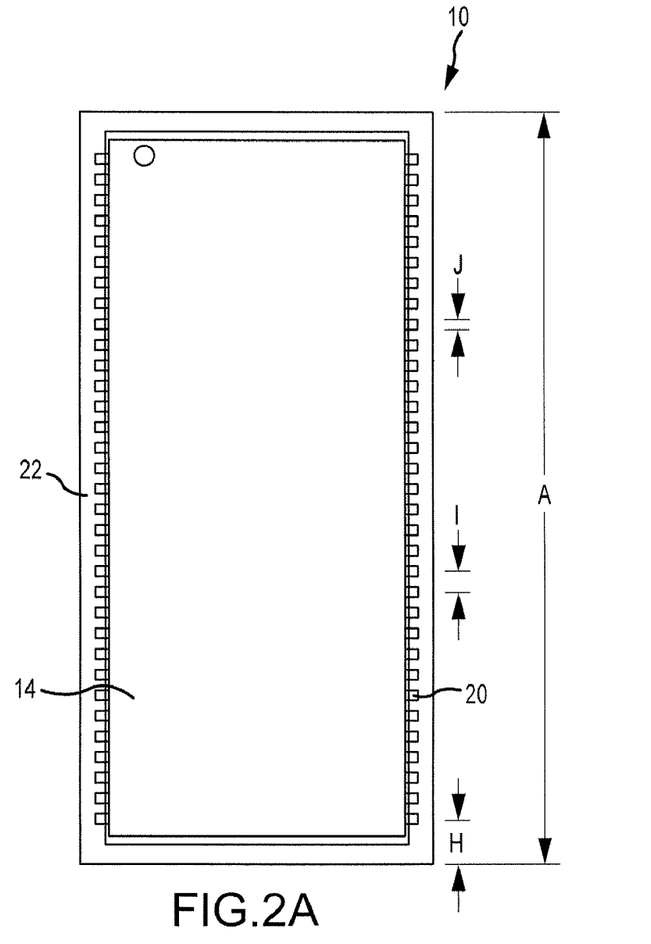
FIG. 2A is a top view the memory chip stack module of FIG. 1A, according to aspects of an embodiment of the invention.
Figure 2B:
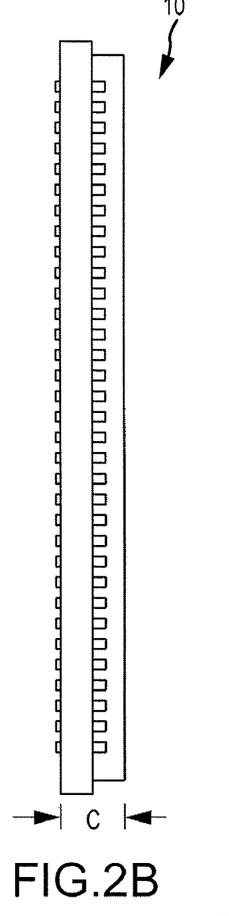
FIG. 2B is a side view the memory chip stack module of FIG. 1A, according to aspects of an embodiment of the invention.
Figure 2C:
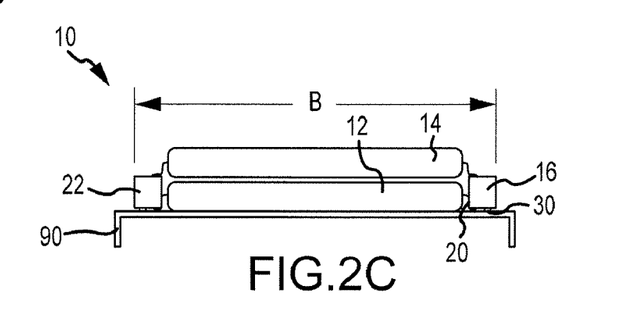
FIG. 2C is a front view of the memory chip stack module of FIG. 1A, further illustrating the preformed support structure vertically connecting the first chip with the second chip, according to aspects of an embodiment of the invention.

FIGS. 2A, 2B, and 2C show a top view, a side view, and a front view, respectively, of the chip stack module 10 shown in FIG. 1A. As illustrated in FIG. 2A, the chip stack module 10 comprises a length A, a distance H between an end of the frame 22 and a longitudinal centerline of a first surface contact 20 of the second chip 14, a distance I between the longitudinal centerlines of any two adjacent surface contacts 20, and a surface contact width J. In the side view of chip stack module 10, FIG. 2B illustrates the height C.

In one embodiment, the length A of the chip stack module 10 is such that the frame 22 accommodates the surface mount pads 24 corresponding to the surface contacts 20 on each side of the chips 12, 14. In another embodiment, the frame length A and/or the frame width E may be adjusted to accommodate other sizes and packages of integrated circuits. As illustrated in FIGS. 1A and 2A, the chip stack module 10 occupies only slightly more area on the substrate or printed circuit board as would a single one of the chips 12, 14.

FIG. 2C illustrates the chip stack module 10 mounted on a substrate or printed circuit board 90. It can be seen that the width 13 of the chip stack module 10 is much less than the width that two chips 12, 14 would require if placed side by side on the substrate or printed circuit board. Of course, in other embodiments, the width B of the chip stack module may change to accommodate chip stacks of greater than two chips and chips with different packages and pin configurations than the chips 12, 14 of the chip stack module 10 specified herein.

FIG. 2C further illustrates the structure of the chip stack module 10. Chip 14 is stacked on top of chip 12 and support structure 16 is interposed between the surface contacts 20 of the stacked chips 12, 14 such that the surface mount pads 24 align with the surface contacts 20. FIG. 2C also illustrates the solder bumps 30 and surface contacts 20 on the bottom surface of the support structure 16. The solder bumps 30 are offset from the surface contacts 20 and are used to conduct isolated signals from chip 14 to the printed circuit board 90. The surface contacts 20 have a thickness which is interposed between the surface mount pad 24 on the bottom surface of the support structure 16 and the printed circuit board 90. The solder bumps 30 also have a thickness or radius, which is also interposed between the bottom surface of the support structure 16 and the printed circuit board 90. The solder bumps 30 are formed so as to substantially approximate the thickness of the surface contacts 20.

Figure 2D:
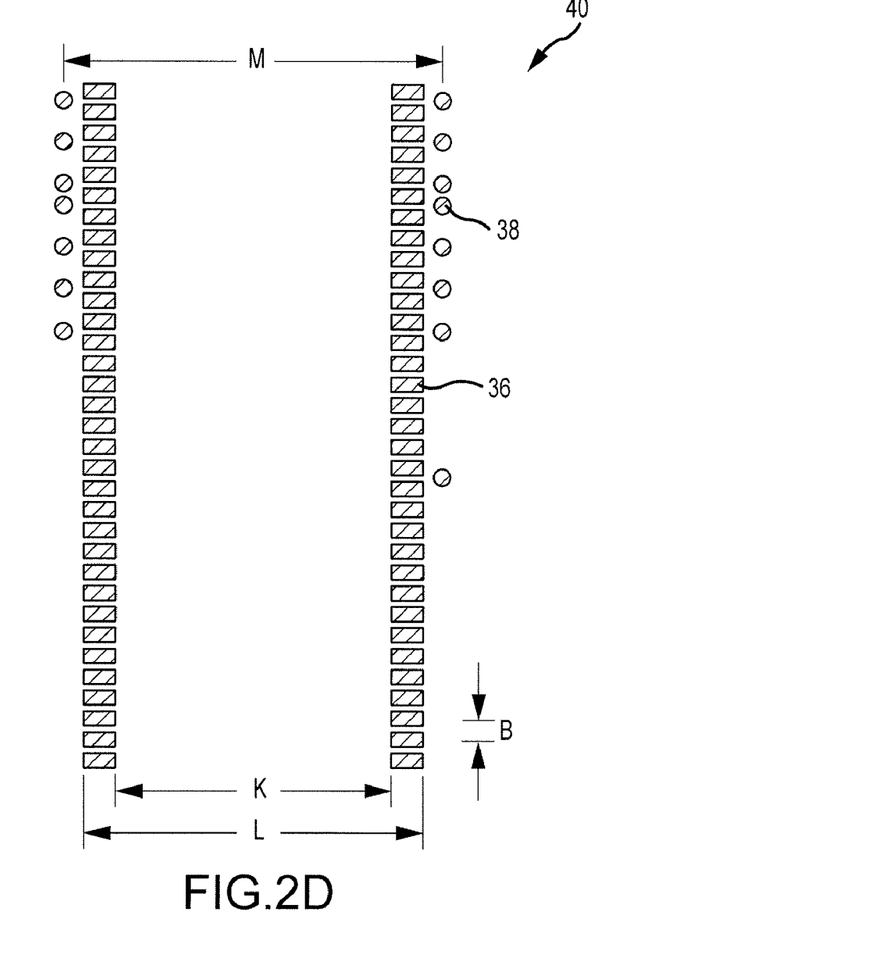
FIG. 2D is a footprint of the memory chip stack module of FIG. 1A illustrating the area of the chip stack on a printed circuit board, according to aspects of an embodiment of the invention.

FIG. 2D illustrates a footprint 40 of the chip stack module 10. The footprint 40 comprises a plurality of surface mount pads 36, 38 on the substrate or printed circuit board 90 so as to be able to mechanically and conductively connect the chip stack module 10 to the printed circuit board 90. Surface mount pads 36, 38 corresponds to the surface mount pads 24 and solder bumps 30 on the bottom surface of the stacked chip module 10, respectively. The footprint 40 of the chip stack module 10 further comprises a distance K between an inside edge of the surface mount pad 36 and the inside edge of the opposing surface mount pad 36, a distance L between an outside edge of the surface mount pad 36 and the outside edge of the opposing surface mount pad 36, and a distance M between a centerline of the solder bump footprint 38 in a first row of solder bump footprints 38 and the centerline of the solder bump footprint 38 in a second row of solder bump footprints 38. The footprint 40 of the chip stack module 10 further comprises a distance N between a longitudinal centerline of the surface mount pad 36 to the longitudinal centerline of the adjacent surface mount pad 36.

In one implementation, when the chip stack module 10 is mounted on the printed circuit board 90, surface contact 20 of chip 12 is positioned on surface mount pad 36 of footprint 40. Alternately, it may be appreciated that a separate solder bump 30 conductively connected to the surface contact 20 of chip 12 may be positioned on solder bump footprint 38.

As can be seen from FIGS. 2A, 2C, and 2D, the footprint 40 of the chip stack module 10 requires much less area of the printed circuit board 90 than the area that would be required by both chips 12, 14 mounted individually and laterally on the printed circuit board 90. The chip stack module 10 allows the chip density to increase without increasing the size of the printed circuit board 90.

Figure 2E:
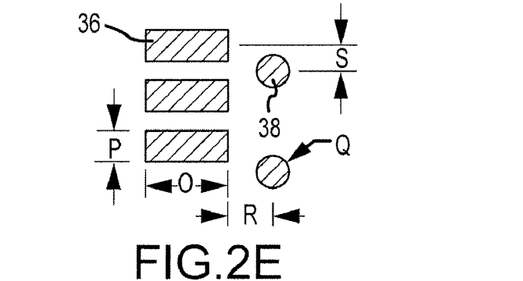
FIG. 2E is a detail of the chip stack module footprint of FIG. 2D further illustrating spacing between pads of the chip stack module, according to aspects of an embodiment of the invention.

FIG. 2E illustrates an enlarged detail of the footprint 40 of FIG. 2D. Surface mount pads 36 comprise a length O and a width P. The solder bump footprint 38 comprises a diameter Q. The footprint 40 further comprises a distance R between the outside edge of the surface mount pad 36 and the centerline of the solder bump footprint 38, and a distance S between the longitudinal centerline of the surface mount pad 36 and the centerline of the solder bump footprint 38. The distance R between the outside edge of the surface mount pad 36 and the centerline of the footprint 38 corresponds to the aforementioned offset between the row of surface mount pads 24 and the row solder bumps 30 on the frame 22.

In one embodiment, chip stack module 10 comprises an 81-terminal 4M bit×32 bit memory chip stack module comprising two vertically stacked memory chips 12, 14. The memory chips 12, 14 are conventional 66-pin surface mount TSOP-II (thin small outline package) DDR SDRAM (double data rate synchronous dynamic random access memory) integrated circuits, available from Micron, Samsung, Elpida, and the like. Each memory chip 12, 14 has a capacity of 4M bits ×16 bits×4 banks of memory and comprises a plurality of surface contacts 20 distributed in two rows of 33 pins in each row, along opposing sides of the chips as is generally well known in the art. In this embodiment, the length A and height F of the frame 22, the number of surface mount pads 24, the spacing of the surface mount pads 24 along the frame 22, and the like, is such as to accommodate the standard 66-pin, 400 mil TSOP-II packages of the chips 12, 14. Spacing and alignment of each row of surface mount pads 24 on the frame 22 corresponds to each row of 33 surface contacts 20 of the chips 12, 14.

Table A shows approximate dimensions A through S as illustrated in FIGS. 1A, 2A, 2B, 2C, 2D, and 2E, for one embodiment wherein chips 12, 14 are packaged in TSOP-II packages. All dimensions are approximate and are in inches. Dimensional tolerances are +/−0.004 inches.

TABLE A

| A | 0.890 | K | 0.379 |
|---|---|---|---|
| B | 0.568 | L | 0.4910 |
| C | 0.090 | M | 0.5310 |
| D | 0.005 | N | 0.026 |
| E | 0.064 | O | 0.056 |
| F | 0.043 | P | 0.016 |
| G | 0.440 | Q | 0.020 |
| H | 0.030 | R | 0.020 |
| I | 0.026 | S | 0.013 |
| J | 0.012 | | |

Of course, in other embodiments, the above dimensions may change to accommodate chip stack modules of greater than two chips and chips with different packages and pin configurations than the chips 12, 14 of the chip stack module 10 specified herein.

Figure 3A:
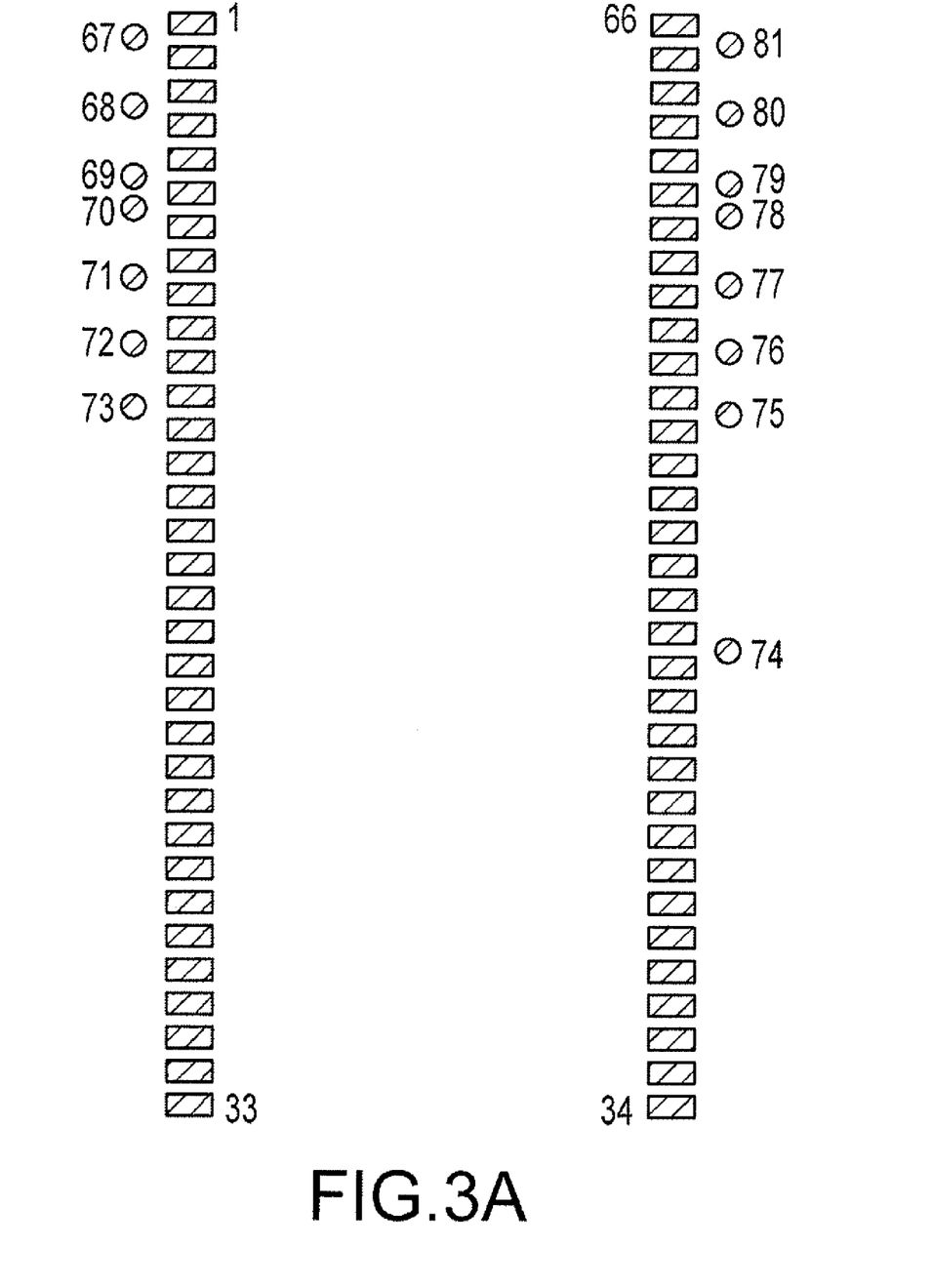
FIG. 3A is a pin location map of the memory chip stack of FIG. 1A, according to aspects of an embodiment of the invention.
Figure 3B:
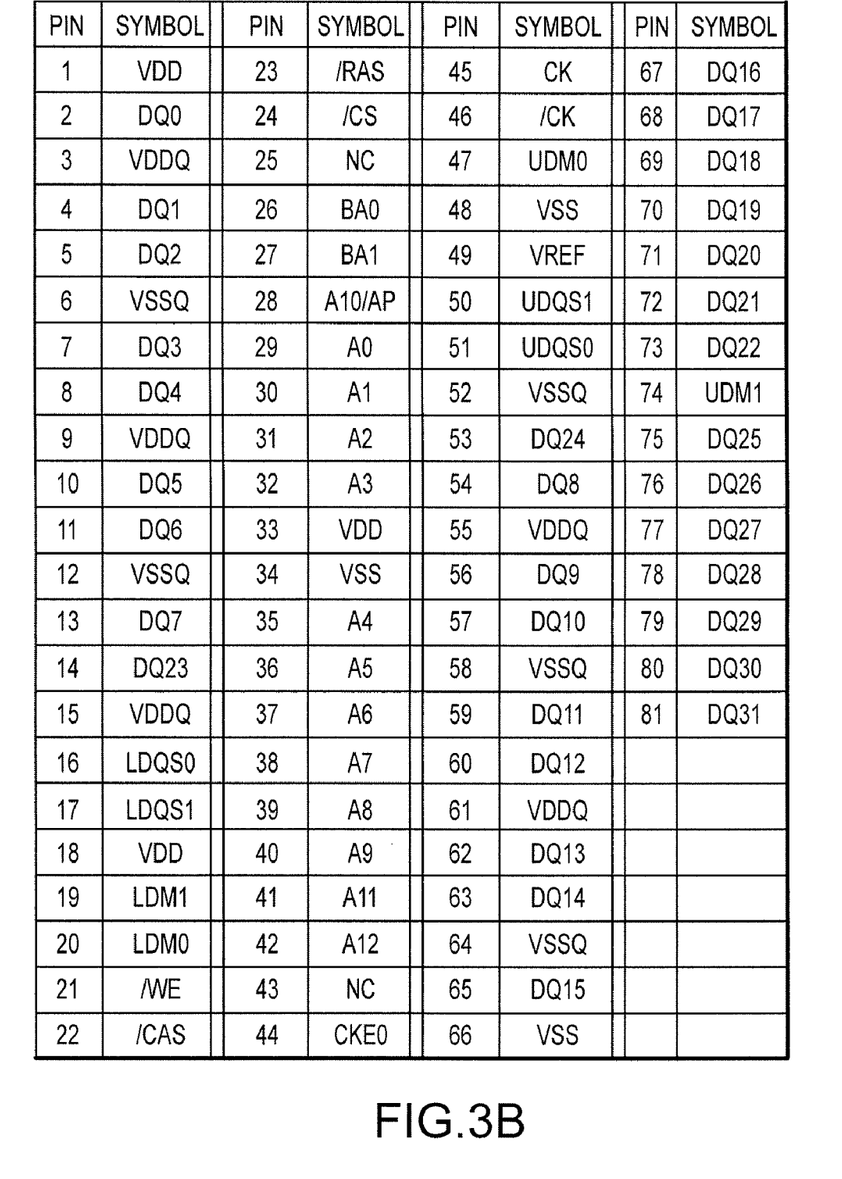
FIG. 3B is pin symbol table of the memory chip stack of FIG. 1A, according to aspects of an embodiment of the invention.
Figure 3C:
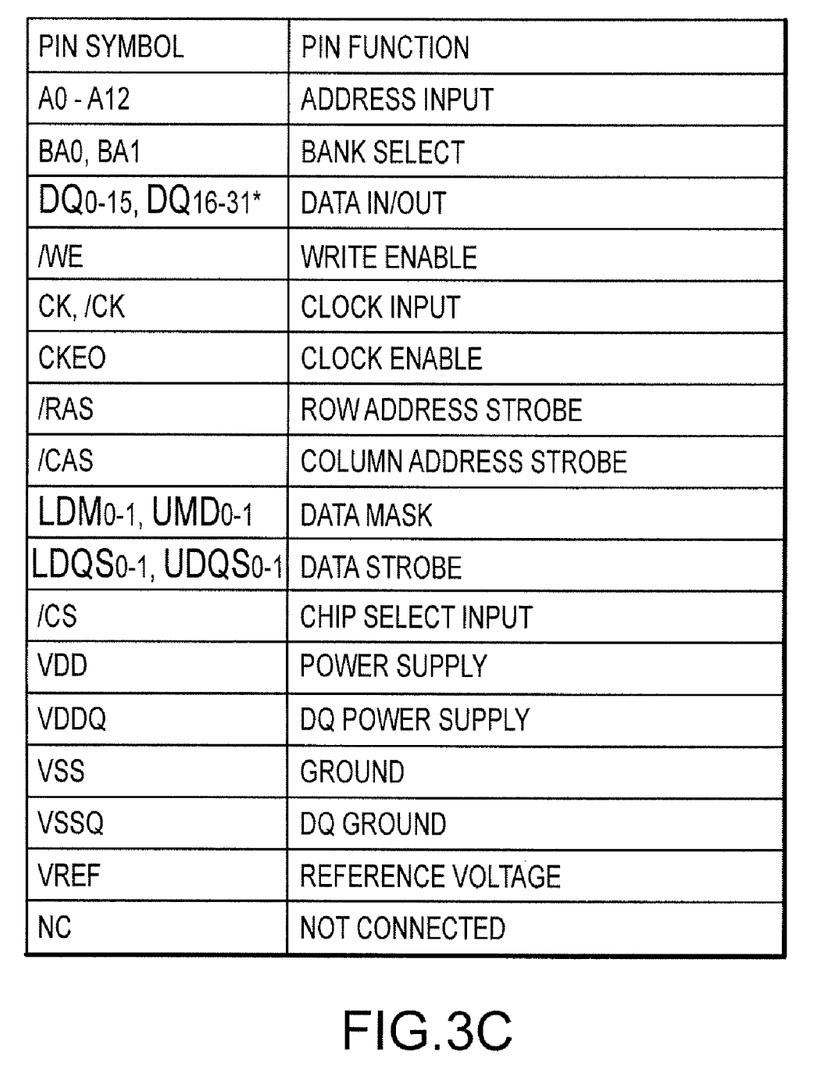
FIG. 3C is a pin function table of the memory chip stack of FIG. 1A, according to aspects of an embodiment of the invention.

FIGS. 3A, 3B, and 3C illustrate a pin location diagram, a pin configuration table, and a pin function table, respectively, of the memory chip stack module 10. As described earlier, the 81-terminal memory chip stack module 10 is one embodiment of the present invention and is a 4M×32 bits×4 banks of DDR SDRAM consisting of two 2.5V CMOS 4M×16 bits×4 banks DDR SDRAMs in 66-pin 400-mil TSOP-II packages. In one embodiment, the memory chips 12, 14 are interconnected such that both 4M bit×16 bit memory chips 12, 14 are selected simultaneously with each memory chip 12, 14 supplying or storing 16 bits of data. Also described earlier, some signals on each memory chip 12, 14 are individually accessed and not interconnected in order for memory chip stack module 10 to operate properly. From the pin location diagram shown in FIG. 3A, the signals on pins 67-81 connect from chip 14 through solder bumps 30 to the substrate or printed circuit board and are electrically isolated from the signals on chip 12, aligned and located directly beneath. Referring to FIGS. 3B and 3C, the signals on memory chip stack module 10 pins 67-81 comprise data in/out signals from the upper 16 bits of the 32-bit word and a data mask signal.

Figure 4:
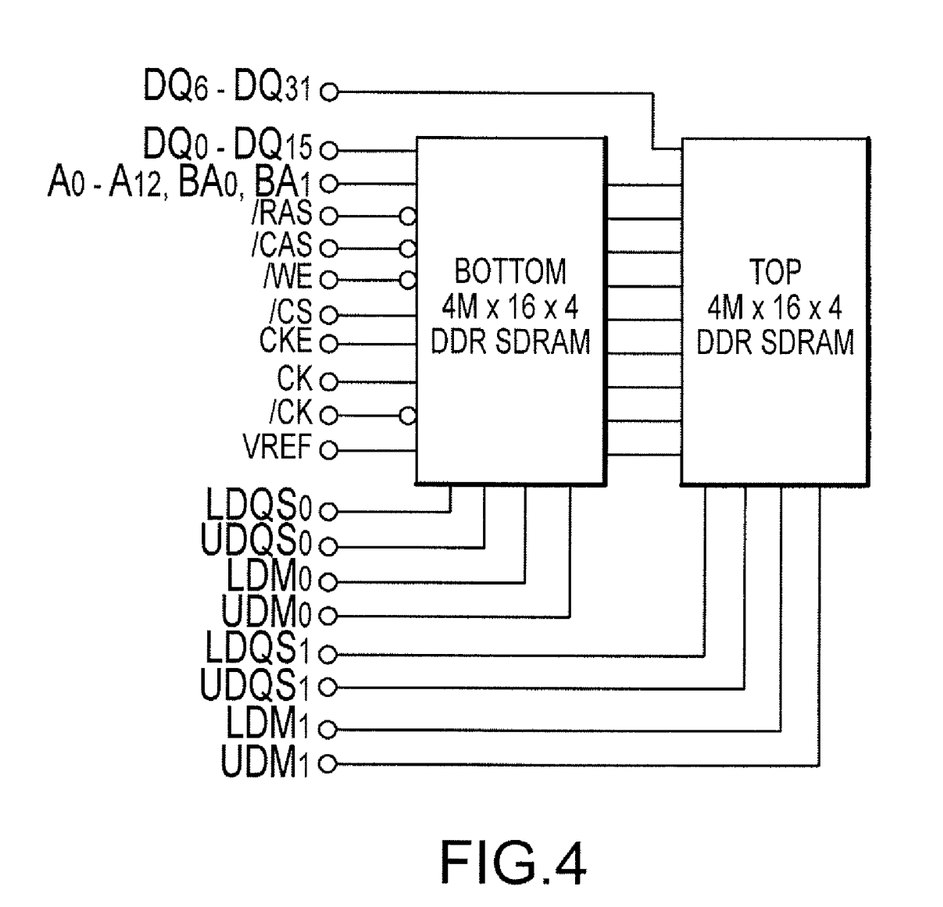
FIG. 4 is a functional block diagram of the memory chip stack of FIG. 1A, according to aspects of an embodiment of the invention.

FIG. 4 is a functional block diagram of the memory chip stack module 10 and illustrates the interconnection of memory chips 12 and 14 within the memory chip stack module 10. Pin symbols are shown to the left of FIG. 4. Referring to FIGS. 3C and 4, common signals such as address pins (A0-A12, BA0, BA1), control pins (/RAS, /CAS, /WE, /CS, CKE), clock (CK, /CK), and voltage reference (VREF) of chips 12, 14 are connected together while individual signals such as data pins (DQ0-DQ31) and control pins (LDM0-1, UDM0-1, LDQS0-1, UDQS0-1) are not interconnected.

The aforementioned description is one embodiment of the chip stack module of the present invention. It is possible to stack chips with different packaging than described above. Modifications in the frame dimensions, number of surface mount contacts, number of vias, number of solder bumps, and number of interconnecting traces of the support structures, and the like, can be made to accommodate stacking chips packaged in industry standard surface mount packages such as quadruple flat packs, and the like, custom surface mount packages, and the like.

In another embodiment, the stacking method and apparatus described herein are used for stacking chips, such as SRAM and Flash RAM memory chips, and the like, and non-memory chips, such as buffer chips, logic driver chips, and the like.

Another embodiment of the present invention comprises stacking chips in stacks of greater than two chips. The vertically stacked chips are held together and conductively connected by support structures. The support structures and chips are layered such that a first support structure is positioned over a first chip. Surface mount pads on a bottom surface of the first support structure are over and align with the surface contacts of the first chip. A second chip is positioned over the first support structure such that the surface contacts of the second chip are over and align with surface mount contacts on a top surface of the first support structure. A second support structure is positioned over the second chip. The surface mount pads on the bottom surface of the second support structure are over and align with the surface contacts of the second chip. A third chip is positioned over the second support structure such that the surface contacts of the third chip are aligned and over the surface mount pads on the top surface of the second support structure. It will be appreciated that in additional embodiments, additional layers of support structures and chips could be formed to extend the height of and the number of chips in the chip stack module 10 in the manner previously described.

Figure 5A:
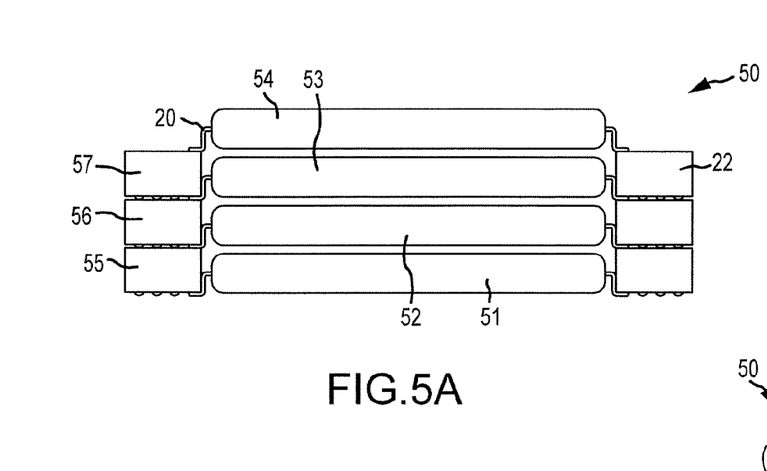
FIG. 5A is a front view of a chip stack module illustrating widened preformed support structures vertically connecting a first chip, a second chip, a third chip, and a fourth chip, according to aspects of an embodiment of the invention.

FIG. 5A illustrates the structure of a chip stack module 50 comprising greater than two vertically stacked chips, according to one embodiment of the present invention. FIG. 5A shows a front view of the chip stack module 50 comprising vertically stacked chips 51, 52, 53, 54 and support structures 55, 56, 57. Stacked chips 51, 52, 53, 54 comprise surface contacts 20 distributed along a first and a second edge of each chip 51, 52, 53, 54 as is well known in the art. The support structures 55, 56, 57 in this embodiment comprises the frame 22. Frame members across sides of chips 51, 52, 53, 54 without surface contacts 20 are not shown in FIG. 5A in order to illustrate the stacking of chips 51, 52, 53, 54. Support structures 55, 56, 57 comprise a row of surface mount pads 24 disposed linearly along a top surface and a row of surface mount pads 24 disposed linearly along a bottom surface of each support structure 55, 56, 57. In another embodiment, support structures 55, 56, 57 can be frames, pairs of rails, or the like. Support structure 55 is interposed between stacked chips 51, 52; support structure 56 is interposed between stacked chips 52, 53; and support structure 57 is interposed between stacked chips 53, 54. The support structures 55, 56, 57 are interposed between stacked chips 51, 52, 53, 54 such that the surface mount pads 24 on the bottom surfaces of support structures 55, 56, 57 are over and align with the surface contacts 20 of chips 51, 52, 53, respectively. In a similar manner, the surface mount pads 24 of the top surfaces of support structures 55, 56, 57 are under and align with the surface contacts 20 of chips 52, 53, 54, respectively. The assembled chip stack module 50 is processed so as to induce conductive material, such as the aforementioned high temperature solder, to connect to the surface contacts 20 and surface mount pads 24 so that the chip stack module 50 can be subsequently mounted to the substrate or printed circuit board using a solder with a lower melting point without melting the conductive material connecting the chips 51, 52, 53, 54 and the support structures 55, 56, 57 together. Other conductive materials that may be used are silver, copper, and the like.

A further embodiment of the present invention comprises a widened frame to accommodate additional vias and solder bumps to conductively isolate signals from greater than two stacked chips. In one aforementioned embodiment, vias 28, filled with conductive material 29, disposed vertically through the support structure 22 and solder bumps 30 on the bottom surface of the support structure 22 conduct signals from the upper chip 14 of the two chip stack to the printed circuit board without conductively connecting the signal to any other signals from the upper chip 14 or lower chip 12 in the two chip stack module 10. In an embodiment comprising greater than two stacked chips, signals from the additional chips are conducted by additional vias 28 and solder bumps 30 through the stacked support structures 16 to the printed circuit board 90 without conductively connecting the signal to any other signals in the chip stack module. The additional solder bumps 30 are offset from the surface mount pads 24 and each other on the support structures 16. The width E of the support structure 16 may be increased to accommodate as many solder bumps 30 and vias 28 as are required to conduct signals from the chip stack module to the substrate 90 without electrically connecting to any other signals.

Figure 5B:
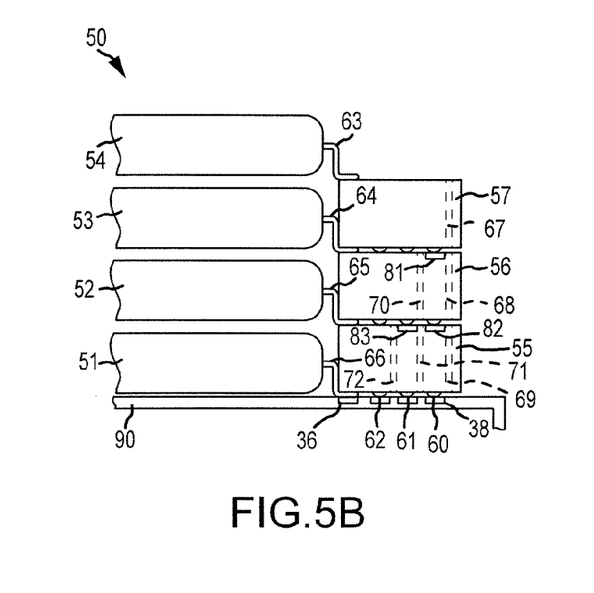
FIG. 5B is an enlarged detail of the chip stack module of FIG. 5A illustrating the connection path of isolated signals, according to aspects of an embodiment of the invention.

FIG. 5B shows an enlarged detail of the chip stack module 50 of FIG. 5A illustrating the connection path of isolated signals, according to aspects of an embodiment of the invention. Chip stack module 50 is shown mounted to printed circuit board 90 comprising surface mount pads 36 and solder bump footprints 38. Support structure 57 further comprises a first solder bump 60, a second solder bump 61, and a third solder bump 62 of support structure 57, conductive traces 26, 32, and via 67. Similarly, support structure 56 further comprises the first solder bump 60, the second solder bump 61, and the third solder bump 62 of support structure 56, conductive traces 26, 32, and vias 68, 70. Support structure 56 further comprises a solder bump surface mount pad 81. Likewise, support structure 55 further comprises the first solder bump 60, the second solder bump 61, and the third solder bump 62 of support structure 55, conductive traces 26, 32, and vias 69, 71, 72. Support structure 55 further comprises a solder bump surface mount pad 82, 83. Chips 51, 52, 53, 54 each further comprise a first isolated signal on a first isolated surface contact 66, 65, 64, 63, respectively. Vias 67-72 comprise a via opening filled with conductive material 29 such that the vias 67-72 are electrically conductive from a top surface of vias 67-72 to a bottom surface of vias 67-72, respectively.

FIG. 5B shows a side view of chip stack module 50. The traces 26 located on top surfaces of the support structures 55, 56, 57 and the traces 32 located on bottom surfaces of the support structures 55, 56, 57 are not shown. The traces 26, 32 and the solder bump surface contact 81 are further discussed with reference to FIG. 5C Referring to FIG. 5B, the isolated surface contact 63 of chip 54 conductively connects to the surface mount pad 24 on the top surface of support structure 57. Conductive trace 26 conductively connects the surface mount pad 24 on the top surface of support structure 57 to the top surface of via 67 and conductive trace 32 conductively connects the bottom surface of via 67 to the first solder bump 60 of support structure 57. The first solder bump 60 of support structure 57 conductively connects to the solder bump surface mount pad 81 on the top surface of support structure 56. Conductive trace 26 conductively connects the solder bump surface mount pad 81 on the top surface of support structure 56 to the top surface of via 68. Conductive trace 32 conductively connects the bottom surface of via 68 to the first solder bump 60 of support structure 56. The first solder bump 60 of support structure 56 conductively connects to a solder bump surface mount pad 82 on the top surface of support structure 55. Conductive trace 26 conductively connects the solder bump surface mount pad 82 on the top surface of support structure 55 to the top surface of via 69. Conductive trace 32 conductively connects the bottom surface of via 69 to the first solder bump 60 of support structure 55. The first solder bump 60 of support structure 55 conductively connects to the corresponding solder bump footprint 38 of the printed circuit board 90. Thus, the first isolated signal of chip 54 conductively connects to the printed circuit board 90 through traces 26, 32, vias 67, 68, 69, first solder bumps 60 of support structures 55, 56, 57 and corresponding solder bump surface mount pads 81, 82 of support structures 56, 55, respectively, without interconnecting to any other signal on chips 51, 52, 53, 54.

In a similar manner, the first isolated signal of chip 53 on the first isolated surface contact 64 conductively connects to the solder bump footprint 38 on printed circuit board 90 through traces 26, 32, vias 70, 71, second solder bumps of support structures 55, 56, and the corresponding solder bump surface mount pad 83 of support structure 55.

Likewise, the first isolated signal of chip 52 on the first isolated surface contact 65 conductively connects to the solder bump footprint 38 on printed circuit board 90 through traces 26, 32, via 72, and the third solder bump of support structure 55. The first isolated signal of chip 51 on the first isolated surface contact 66 conductively connects directly to the surface mount pad 36 on the printed circuit board 90.

In one embodiment, the width E of the frame 22 increases to accommodate the additional solder bumps 60, 61, solder bump surface mount contacts 81-83, and vias 67-71. In another embodiment, the additional solder bumps 60, 61, solder bump surface mount contacts 81-83, and vias 67-71 may be located along the frame 22 in such a manner as not to increase width E of the frame 22.

Figure 5C:
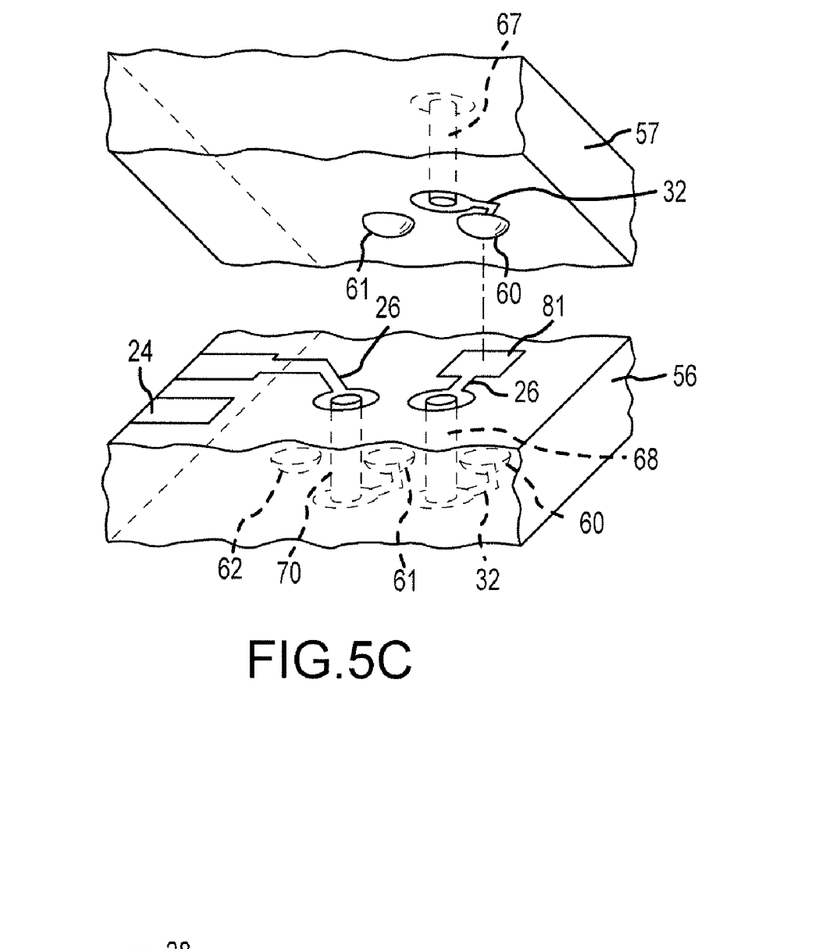
FIG. 5C is a detail, perspective view of a portion of the preformed support structures of FIG. 5B, according to aspects of an embodiment of the invention.

FIG. 5C illustrates a detail, perspective view of a portion of the preformed support structures 56, 57 of FIG. 5B, according to aspects of an embodiment of the invention. Support structure 56 comprises surface mount pads 24, traces 26, vias 68, 70, solder bump surface mount pad 81, traces 32, and the first solder bump 60, the second solder bump 61, and the third solder bump 62 of support structure 56. As shown in FIG. 5B, the isolated surface contact 63 of chip 54 conductively connects from the surface mount pad 24 on the top surface of support structure 57 through conductive trace 26 to the top surface of via 67. Referring to FIG. 5C, conductive trace 32 connects the first solder bump 60 of support structure 57 to the bottom surface of via 67. The first solder bump 60 of support structure 57 conductively connects with the solder bump surface mount pad 81 on the top surface of support structure 56. Conductive trace 26 on the top surface of support structure 56 conductively connects solder bump surface mount pad 81 to a top surface of via 68. Conductive trace 32 on the bottom surface of support structure 56 conductively connects a bottom surface of via 68 to the first solder bump 60 on the support structure 56.

To complete the conductive path to the printed circuit board 90, refer to FIG. 2B. The first solder bump 60 on the support structure 56 conductively connects through the solder bump surface mount pad 82 on the top surface of support structure 55, through trace 26 on the top surface of support structure 55, via 69, trace 32 on the bottom surface of support structure 55 to the first solder bump 60 of support structure 55. The first solder bump 60 of support structure 55 conductively connects to the printed circuit board 90 through solder bump footprint 38.

Solder bumps 60, 61, 62 and solder bump surface mount pads 80 are positioned on support structures 55, 56, 57 such that the solder bumps 60, 61, 62 on the bottom surface of support structures 55, 56, 57 are over and align with solder bump surface mount pads 80 on top surfaces of the support structure 55, 56, or 57 which is located below and adjacent. More specifically, in one embodiment, the first solder bump 60 of support structure 57 is over and aligns with solder bump footprint 81. The first solder bump 60 of support structure 56 is over and aligns with solder bump footprint 82 and the second solder bump 61 of support structure 57 is over and aligns with solder bump footprint 83.

FIG. 5C further illustrates the conduction path of the first isolated signal of chip 53 on the first isolated surface contact 64 through the support structure 56. The first isolated signal of chip 53 on the first isolated surface contact 64 conductively connects to the surface mount pad 24 on the top surface of support structure 56, shown in FIG. 5B. Referring to FIG. 5C, conductive trace 26 on the top surface of support structure 56 conductively connects the surface mount pad 24 to the top surface of via 70. Conductive trace 32 on the bottom surface of support structure 56 conductively connects the bottom surface of via 70 to the second solder bump 61 of support structure 56.

As illustrated in FIGS. 5B and 5C, the solder bump surface mount pads 81-83 and the solder bumps 60-62 are offset from vias 67-72. The solder bump surface mount pads 81-83 conductively connect to the top surfaces of vias 67-72 through traces 26 and the solder bumps 60-62 conductively connect to the bottom surfaces of vias 67-72 through traces 32. However, in another embodiment, it is to be appreciated that a conductive pad may be located on the via to avoid conductive traces 26, 32 in some circumstances.

Figure 5D:
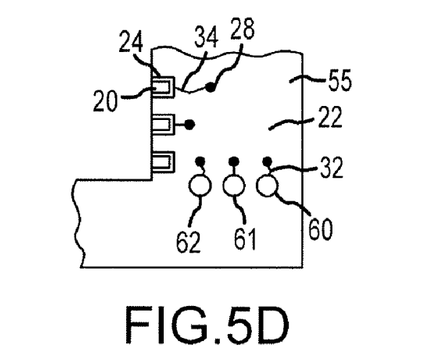
FIG. 5D is a bottom surface view of a portion of the chip stack module of FIG. 5A illustrating the connection path of isolated signals, according to aspects of an embodiment of the invention.

FIG. 5D shows a bottom surface view of a portion of the chip stack module 50 of FIG. 5A further illustrating the connection path of isolated signals, according to aspects of an embodiment of the invention. The bottom of chip stack module 50 comprises surface contacts 20 from chip 51 and support structure 55. Support structure 55 comprises the frame 22, surface mount pads 24, vias 28, conductive traces 32, 34, the first solder bump 60, the second solder bump 61, and the third solder bump 62. Referring to FIG. 5D, the surface contacts 20 are conductively connected to the surface mount pads 24. Conductive traces 28 conductively connect vias 28 to the surface mount pads 24 for interconnected signals common to chips 51, 52, 53, 54. Conductive traces 32 conductively connect vias 28 to the solder bumps 60, 61, 62 for the individually accessed signal of chips 52, 53, 54.

Figure 5E:
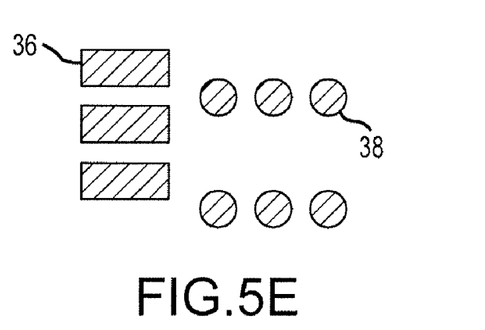
FIG. 5E is a detail of a footprint of the chip stack module of FIG. 5A, according to aspects of an embodiment of the invention.

FIG. 5E is shows a detail of a footprint of the chip stack module 50 of FIG. 5A, according to aspects of an embodiment of the invention. The footprint comprises surface mount pads 36 corresponding to the surface mount pads 24 and surface mount pads 38 corresponding to the solder bumps 60, 61, 62 of the chip stack module 50. FIG. 5E illustrates the aforementioned offset between the surface mount pads 36 and a first row of surface mount pads 38. FIG. 5E further illustrates the spacing between rows of surface mount pads 38 according to aspects of an embodiment of the invention.

Figure 6A:
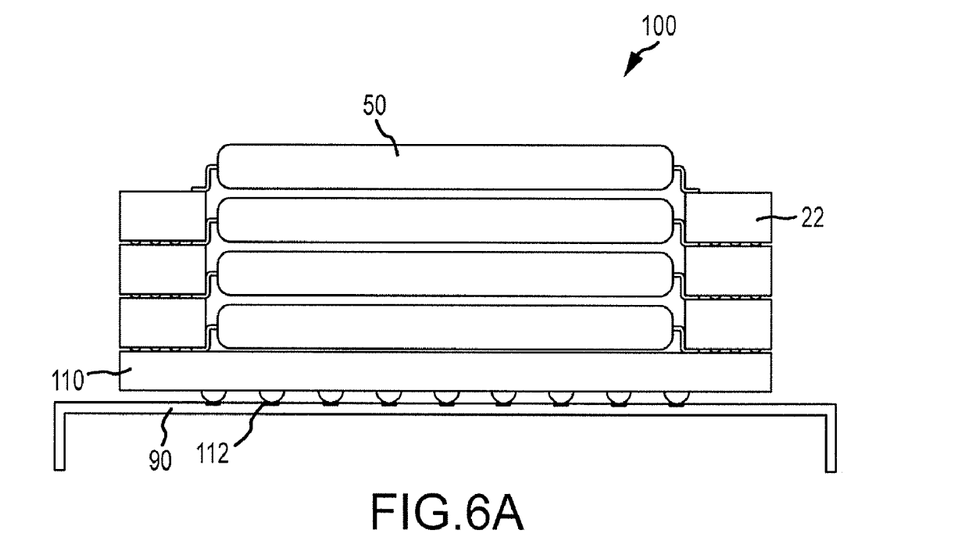
FIG. 6A is a front view of a chip stack tower illustrating a chip stack module mounted onto a ball grid array printed circuit board, according to aspects of an embodiment of the invention.

FIG. 6A illustrates a front view of a chip stack tower 100 comprising the chip stack module 50 mounted onto a substrate 110, according to aspects of an embodiment of the invention. The chip interconnections, signal paths, and footprint of chip stack module 50 are described in detail in FIGS. 5A-5E. The substrate 110 can be utilized to connect the chip stack module 50 to the printed circuit board 90. The substrate 110 is an intermediate printed circuit board and has a footprint. The intermediate printed circuit board 110 may mount to the printed circuit board 90 using a ball grid array on to a plurality of surface contacts 112, as illustrated in FIG. 6A. In another embodiment, the intermediate circuit board 110 may mount to the printed circuit board 90 using surface mount pads, surface mount contacts, pins, and the like. The chip stack tower 100 allows the area occupied by the frame 22 in the chip stack module 50 to be utilized for running traces or the like, on the printed circuit board 90. The height of the chip stack tower 100, however, is greater than the height of the chip stack module 50 by the thickness of the intermediate printed circuit board 110.

Figure 6B:
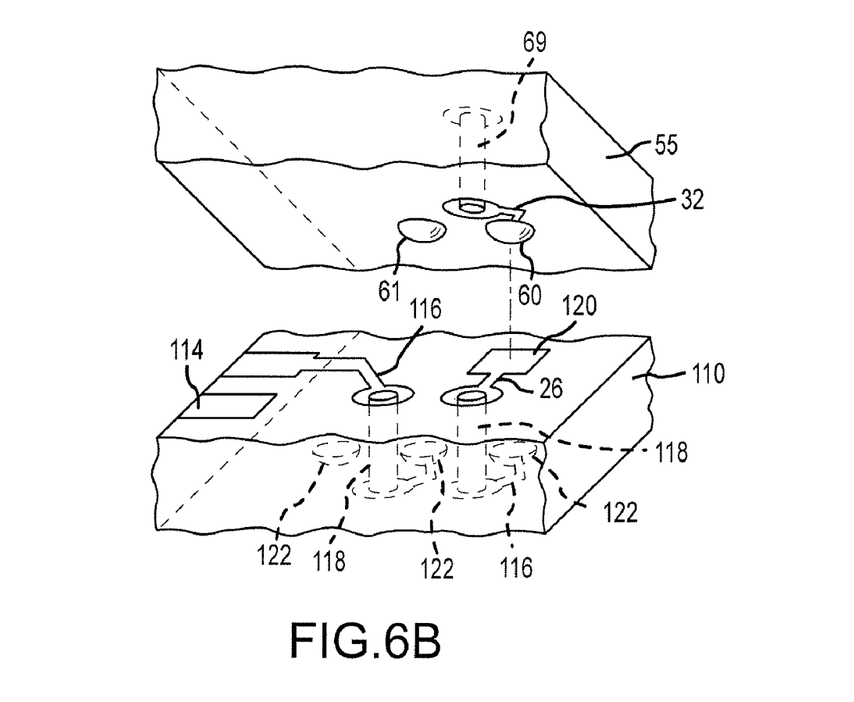
FIG. 6B is a is a detail, perspective view of a portion of the ball grid array printed circuit board of FIG. 6A and the preformed support structure mounted thereon, according to aspects of an embodiment of the invention.

FIG. 6B is a is a detail, perspective view of a portion of the ball grid array printed circuit board 110 of FIG. 6A and the preformed support structure 55 mounted thereon, according to aspects of an embodiment of the invention. The printed circuit board 110 comprises a plurality of surface mount pads 114, a plurality of traces 116, a plurality of vias 118, a plurality of solder mount pads 120, and a plurality of solder balls 122. The surface mount pads 114 receive the chip contact 20 and the solder mount pads 120 receive the solder bumps 60, 61, 62 of the support structure 55. The traces 116 and vias 118 are utilized in routing the signals through the printed circuit board 110 to a bottom surface of the printed circuit board 110. The solder balls 122 on the bottom surface of the printed circuit board 110 mount and conductively connect the chip stack tower 100 to the printed circuit board 90. The signal routing through the printed circuit board 110 and utilization of the surface mount pads 114, traces 116, vias 118, and surface mount pads 120 is very similar to the signal routing through the chip stack module 50, which is described in detail in connection with FIG. 5C and would be obvious to one skilled in the art.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:
1. A chip stack assembly comprising:
a substrate that defines a plurality of surface mount pads;
a first chip having a first set of contacts extending outward;
a second chip having a second set of contacts extending outward therefrom;

at least one support member positioned on the substrate having a first surface with a first set of mounting pads positioned thereon and a second surface having a second set of mounting pads positioned thereon wherein the first and second surfaces are displaced from each other by a first distance in a first direction and wherein the first set of contacts are attached to the first set of mounting pads and the second set of contacts are attached to the second set of mounting pads such that the first and second chips are supported so as to be displaced from each other in the first direction, and wherein the at least one support member further includes at least one interconnect that interconnects at least one contact of the first and second set of contacts so as to electrically interconnect the at least one contact of first and second set of contacts;

a third chip having a third set of contacts extending outward therefrom;

a second support member positioned on the at least one support member, the second support member having a third surface with a third set of mounting pads positioned thereon and a fourth surface having a fourth set of mounting pads positioned thereon wherein the third and fourth surfaces are displaced from each other by the first distance in the first direction and wherein the first set of contacts are attached to the third set of mounting pads and the third set of contacts are attached to the fourth set of mounting pads such that the first and third chips are supported so as to be displaced from each other in the first direction, wherein the at least one support member further includes at least one via connection that extends in the first direction through the at least one support member to the substrate so that at least one individual contact of the first set of contacts can be electrically coupled to the surface mount pad of the substrate while being electrically isolated from the second set of contacts, and wherein the second support member further includes at least one interconnect that interconnects at least one contact of the first and third set of contacts so as to electrically interconnect the at least one contact of first, second, and third set of contacts, and wherein the at least one support member further includes a second via connection that extends in the first direction through the at least one support member to the substrate and wherein the second support member further includes at least one via connection that extends in the first direction through the second support member, to the second via of the at least one support structure to the substrate so that at least one individual contact of the third set of contacts can be electrically coupled to the surface mount pad of the substrate while being electrically isolated from the first and second set of contacts.

2. The chip stack assembly of claim 1, wherein the at least one via connection and the second via connection are displaced from each other by a second distance in a second direction and whereby the second direction is substantially perpendicular to the first direction.

3. The chip stack assembly of claim 1, wherein the first and second surfaces of the at least one support member are substantially parallel to each other.

4. The chip stack assembly of claim 1, wherein the at least one support member comprises a plurality of support members.

5. The chip stack assembly of claim 1, wherein the at least one support member comprises a printed circuit board.

6. The chip stack assembly of claim 1, wherein the at least one via connection comprises:
a conductive trace positioned on the first surface that is electrically coupled to the mounting pad that is coupled to the individual contact of the first set of contacts;
a conductive element extending through a via opening formed between the first and second surfaces of the at least one support member so as to be electrically connected to the conductive trace; and
a solder bump formed on the second surface of the at least one support member adjacent the via opening so as to be electrically connected to the conductive element, and wherein the solder bump is positioned so as to be electrically coupled to the surface mount pad of the substrate.

7. The chip stack assembly of claim 1, wherein the at least one interconnect that interconnects at least one contact of the first and second set of contacts comprises a via interconnection that extends through the at least one support structure.

8. A chip stack for mounting on a substrate having a plurality of contact pads comprising at least a first and a second chip and a conducting interconnecting means for interconnecting the chips and maintaining the chips in a stacked configuration so that the chips are interconnected with at least one contact on the first and second chips being electrically interconnected and wherein the interconnecting means interconnects the at least one of the contacts of the first chip to a contact pad on the substrate in a manner that isolates the contact of the first chip from the contacts of the second chip,
wherein the interconnecting means comprises a support structure having a first and a second side wherein the first side is positioned proximate the substrate to permit electrical connection between the support structure and the substrate and wherein the second side is substantially parallel to the first side,
wherein the support structure includes a plurality of vias extending between the first and second side wherein at least one via extends between the first and second side to permit electrical connection of the at least one contact of the first chip to the contact pad on the substrate in a manner that isolates the contact of the first chip from the contacts of the second chip, and
wherein the at least one of the vias extends to permit electrical interconnection between the at least one contacts on the first and second chip.

9. The chip stack of claim 8, wherein the first and second chips are memory chips.

10. The chip stack of claim 8, wherein the first and second chips are functionally identical.

11. The chip stack of claim 8, wherein the support structure comprises a plurality of support structures.

12. The chip stack of claim 8, wherein the support structure comprises one or more printed circuit boards.

13. The chip stack of claim 8, wherein the support structure provides a support surface so as to maintain the first and second chips in a stacked configuration and wherein the support surface defines a first and second surface with the contacts of the first chip being connected to the first surface and the contacts of the second chip being connected to the second surface.

* * * * *